United States Patent [19]

Rozman et al.

[11] Patent Number: 5,748,939
[45] Date of Patent: May 5, 1998

[54] MEMORY DEVICE WITH A CENTRAL CONTROL BUS AND A CONTROL ACCESS REGISTER FOR TRANSLATING AN ACCESS REQUEST INTO AN ACCESS CYCLE ON THE CENTRAL CONTROL BUS

[75] Inventors: Rodney R. Rozman, Placerville; Richard J. Durante, Citrus Heights; Mickey L. Fandrich, Placerville; Ranjeet Alexis, Citrus Heights, all of Calif.

[73] Assignee: Intel Corporation, Santa Clara, Calif.

[21] Appl. No.: 601,652

[22] Filed: Feb. 14, 1996

Related U.S. Application Data

[63] Continuation of Ser. No. 85,636, Jun. 30, 1993, abandoned.
[51] Int. Cl.[6] .......................... G06F 13/16; G06F 12/00
[52] U.S. Cl. .......................... 395/430; 395/431; 395/481; 395/183.03; 365/185.33; 365/193; 365/189.05; 365/201
[58] Field of Search .......................... 395/430, 431, 395/481, 183.03, 182.05, 182.06; 365/189.05, 193, 201, 185.33

[56] References Cited

U.S. PATENT DOCUMENTS

| | | | |
|---|---|---|---|
| 5,053,990 | 10/1991 | Kreifels et al. | 395/430 |
| 5,065,364 | 11/1991 | Atwood et al. | 365/185.13 |
| 5,159,672 | 10/1992 | Salmon et al. | 395/494 |
| 5,177,745 | 1/1993 | Rozman | 371/21.1 |
| 5,222,046 | 6/1993 | Kreifels et al. | 365/185.22 |
| 5,224,070 | 6/1993 | Fandrich | 365/185.33 |
| 5,233,559 | 8/1993 | Brennan, Jr. | 365/185.09 |
| 5,245,572 | 9/1993 | Kosonocky et al. | 365/185.11 |
| 5,249,158 | 9/1993 | Kynett et al. | 365/185.11 |
| 5,265,059 | 11/1993 | Wells et al. | 365/185.25 |
| 5,506,803 | 4/1996 | Jex | 365/185.23 |

*Primary Examiner*—Tod R. Swann
*Assistant Examiner*—Reginald G. Bragdon
*Attorney, Agent, or Firm*—Blakely, Sokoloff, Taylor & Zafman

[57] ABSTRACT

A memory device includes a cell array having a plurality of memory cells and a read/write circuit having circuitry for selecting, writing, and reading the memory cells according to a plurality of control signals. A control register circuit is provided that has at least one control register coupled to communicate over a central control bus. A control access circuit is provided that receives an access request targeted for the control register, and translates the access request into an access cycle on the central control bus. The access cycle loads the control register and causes the control register circuit to generate the control signals. The control access circuit receives the access request targeted for the control register from an array controller circuit that generates the access request to load the control register and generate the control signals according to a user command received over a host bus. The control register includes an address decode circuit, a function decode circuit, a master data latch, a slave data latch, and a read control circuit.

28 Claims, 11 Drawing Sheets

| REGISTER FUNCTIONS | ACCESS MODE | ADDR. REQUIRED | STROBE REQUIRED | DATA REQUIRED | REGISTER SELECTION |
|---|---|---|---|---|---|
| READ MASTER | 000 | YES | NO | DRIVEN | INDIVIDUAL |
| READ SLAVE | 001 | YES | NO | DRIVEN | INDIVIDUAL |
| RESET MASTER | 010 | NO | YES | NO | GLOBAL |
| RESET SLAVE | 011 | NO | YES | NO | GLOBAL |
| RESET BOTH | 100 | NO | YES | NO | GLOBAL |
| LOAD MASTER | 101 | YES | YES | YES | INDIVIDUAL |
| TRANSFER Mst TO Slv | 110 | NO | YES | NO | GLOBAL |
| LOAD AND TRANSFER | 111 | YES | YES | YES | INDIVIDUAL |

*Figure 6b*

MEMORY DEVICE WITH A CENTRAL CONTROL BUS AND A CONTROL ACCESS REGISTER FOR TRANSLATING AN ACCESS REQUEST INTO AN ACCESS CYCLE ON THE CENTRAL CONTROL BUS

This is a continuation of application Ser. No. 08/085,636, filed Jun. 30, 1993, now abandoned.

BACKGROUND OF THE INVENTION

1. Field of the Invention

The present invention pertains to the field of integrated circuit devices. More particularly, this invention relates to a central control bus for controlling cell array access functions of an integrated circuit memory device.

2. Art Background

A flash memory device contains a flash cell array for nonvolatile random access data storage in a computer system. Prior flash memory devices typically contain specialized circuitry for accessing the flash cell array, for performing test mode functions, and for performing other specialized functions.

For example, flash array write access functions such as program, verify, and erase are accomplished by specialized circuitry. The specialized write access circuitry includes high voltage circuitry for applying programming level voltages and erase level voltages to the flash cell array, as well as row and column circuitry for selecting the flash array cells.

Prior flash memory devices typically implement a write automation circuit for controlling the specialized circuitry during the write access functions. During a write sequence to the flash array, the write automation circuit selects the appropriate flash cells or flash cell blocks with the row and column circuitry. The write automation circuit cycles the high voltage circuitry, and sequences the read path to verify that the correct programming and erase voltage levels are applied to the flash array.

Such a prior write automation circuit usually implements hardwired algorithms for performing the write access functions. The write automation circuit is typically comprised of hardwired circuitry and next state logic. Unfortunately, such a hardwired write automation circuit typically lacks the flexibility required for controlling the specialized circuitry of newer flash memory devices.

In addition, the flash array and the specialized circuitry in a flash memory device usually implement special modes of operation for manufacturing and testing purposes. For example, a typical manufacturing test for a flash memory device determines reference voltage margins by varying the reference voltage levels and reading the flash array. A typical flash memory device also implements special modes for testing the read path of the flash array, the high voltage circuitry, and the write path circuitry.

In some prior flash memory devices, the testing modes for the specialized circuitry are hard wired. In such systems, a preselected address pin of the device is typically coupled to a high voltage detector circuit in the device. If the high voltage detector circuit detects a voltage on the preselected address pin greater than a predetermined level, the high voltage detector circuit causes the specialized circuitry to enter a testing mode.

Other prior flash memory devices implement a test mode register for controlling the testing modes. The test mode register is programmed to select the testing modes and the normal modes. The outputs of the test mode register are used to drive test mode signal lines throughout the device. The test mode signal lines set and clear mode control bits in the specialized circuitry. The mode control bits override normal operating modes and assert the device testing modes.

Unfortunately, such prior flash memory devices having a test mode register offer only a limited number of testing modes. Such devices typically performs only simple testing and cycling of the high voltage circuitry to verify the program and erase functions. Moreover, as the complexity of the specialized circuitry in flash memory devices increases, the need for increased testing flexibility also increases.

SUMMARY AND OBJECTS OF THE INVENTION

One object of the present invention is to provide a central control bus for a flash memory device to enable access to a set of control registers for controlling the specialized circuitry of the flash memory device.

Another object of the present invention is to enable flexible control of the specialized circuitry of a flash memory device for normal user mode operations.

Another object of the present invention is to enable flexible control of the specialized circuitry of a flash memory device to perform test mode functions for manufacturing and test operations.

Another object of the present invention is to enable an external controller to perform test mode functions for a flash memory device.

A further object of the present invention is to enable an internal flash array controller to perform test mode functions for a flash memory device.

These and other objects of the invention are provided by a memory device comprising a cell array with a plurality of memory cells and a read/write circuit for selecting, programming, and reading the memory cells according to a plurality of control signals. A set of control register circuits are coupled to a central control bus. The control register circuits contain a plurality of control registers and specialized logic for generating the control signals. A control access circuit coupled to the central control bus receives access requests targeted for the control registers, and translates the access requests into access cycles on the central control bus targeted for the control registers.

The control access circuit receives the access request targeted for the control registers from an array controller circuit. An interface circuit issues a test mode enable signal to the control access circuit. The test mode enable signal causes the control access circuit to receive the access request targeted for the control registers from the interface circuit.

The control registers include high voltage control registers for controlling a set of high voltage circuits that apply high voltage levels to the memory cells. The control registers also include read only registers for storing a plurality of TTL ("Transistor-Transistor Logic") buffer outputs corresponding to address and data pins of the memory device, and for storing outputs from sense amplifiers for the cell array. The control registers also include test mode registers for controlling the test functions of the memory device.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which:

FIG. 6b defines the access modes specified on the FIOCTL bus for one embodiment;

DETAILED DESCRIPTION

Figure 1:
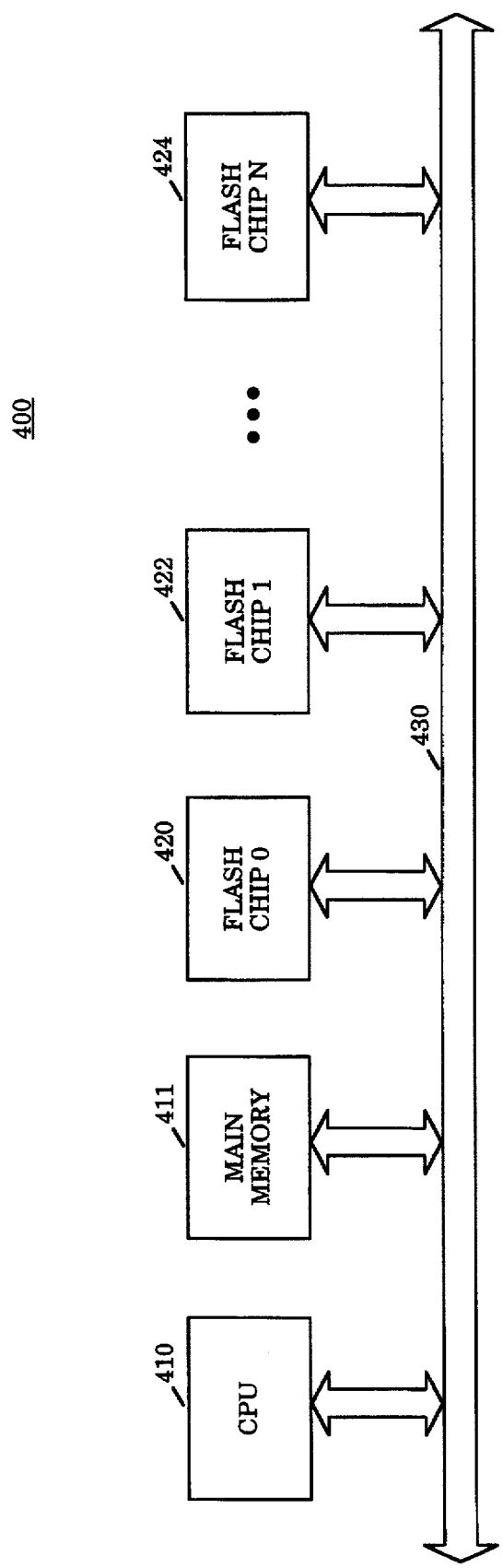
FIG. 1 is a block diagram of a computer system including a central processing unit (CPU), a main memory subsystem, and a set of flash memory devices.

FIG. 1 is a block diagram of a computer system 400. The computer system 400 is comprised of a central processing unit (CPU) 410, a main memory subsystem 420, and a set of flash memory devices 411-424. The CPU 410 communicates with the main memory subsystem 411 and the flash memory devices 420-424 over a host bus 430.

The flash memory devices 420-424 provide random access non volatile large scale data storage for the computer system 400. The CPU 410 reads the contents of the flash memory devices 420-424 by generating read memory cycles over the host bus 430. The CPU 410 writes to the flash memory devices 420-424 by transferring write commands and write data blocks to the flash devices 420-424 over the host bus 430.

Figure 2:
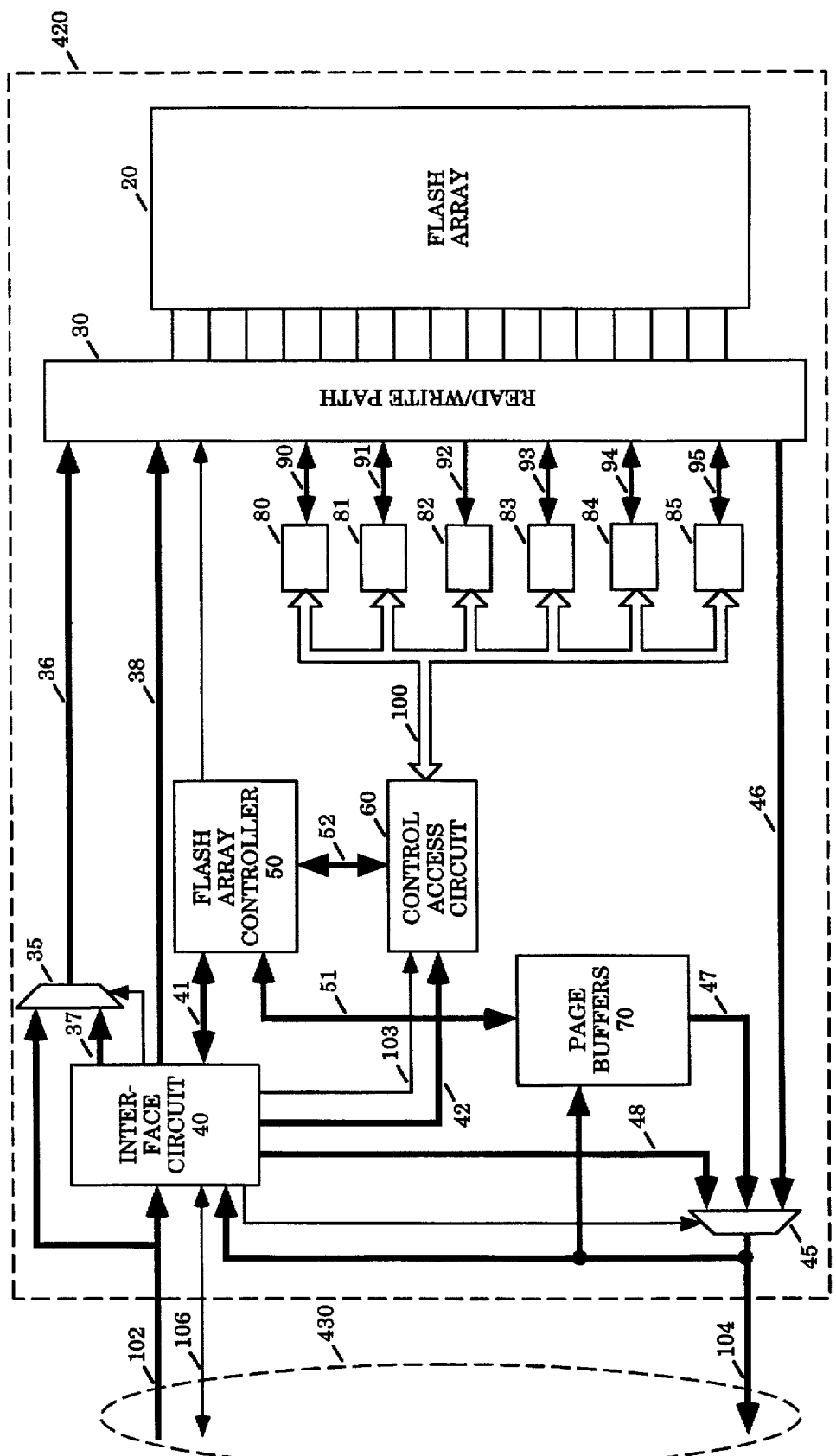
FIG. 2 is a block diagram of the flash memory device including a flash cell array, an interface circuit, a flash array controller, a set of page buffers, a set of control register circuits, and a set of read/write path circuitry.

FIG. 2 is a block diagram of the flash memory device 420. The flash memory device 420 is comprised of a flash cell array 20, an interface circuit 40, a flash array controller 50, a set of page buffers 70, a set of control register circuits 80-85, and a set of read/write path circuitry 30. The host bus 430 comprises an address bus 102, a data bus 104, and a control bus 106.

The flash cell array 20 provides random access non volatile large scale data storage. For one embodiment, the flash cell array 20 is arranged as a set of 32 64k byte data storage blocks.

The read/write path circuitry 30 comprises read and write path circuitry for accessing the flash array 20. For example, the read/write path circuitry 30 includes row and column address decoding circuitry for the flash array 20. The read/write path circuitry 30 also includes redundancy circuitry for overriding addresses if a bad flash cell is detected in the flash array 20. The read/write path circuitry 30 also includes mini array circuitry for generating reference flash bits, and sense path circuitry for comparing the reference flash bits to bits from the flash array 20 to determine whether the bits are logic 1 or logic 0.

The read/write path circuitry 30 also includes multiplexer circuitry for selecting between bits from the flash array 20 and redundant bits, as well as multiplexer circuitry for selecting between the high and low bytes of the flash array 20 to provide for 8 bit and 16 bit accesses. The read/write path circuitry 30 includes output buffer circuitry for driving data from the flash array 20 over output pads of the flash memory device 420.

The read/write path circuitry 30 includes address transition detection circuitry. The address transition detection circuitry generates control pulses when address transitions are detected. The control pulses are employed to speed column charging at the outputs of the flash array 20 before data is ready.

The read/write path circuitry 30 includes high voltage circuitry for accessing the flash array 20. For example, the read/write path circuitry 30 includes VPX (i.e., wordline programming voltage) switching circuitry for setting the wordline voltage for programming data into the flash array 20, and VPY (i.e., bitline programming voltage) generator circuitry for setting the programming load line. The read/write path circuitry 30 also includes VSI (i.e., source voltage for unselected blocks during programming) generator circuitry for setting the source voltage of unselected blocks of the flash array 20 during programming.

The read/write path circuitry 30 also includes digital to analog conversion circuits for generating reference voltage levels for program verify operations, as well as erase verify and post erase repair operations. The read/write path circuitry 30 also includes VPS (i.e., source voltage) switch circuitry for setting the source voltage level to VPP (i.e., programming/erasure voltage) during erase operations.

The control register circuits 80-85 contain sets of specialized control registers and associated circuitry for controlling the read/write path 30. The specialized control registers are accessed over a central control bus 100.

A control access circuit 60 enables both the interface circuit 40 and the flash array controller 50 to access the control register circuits 80-85 over the central control bus 100. During a normal mode of the flash memory device 420, the flash array controller 50 controls the control access circuit 60 and accesses the control register circuits 80-85 over the central control bus 100.

The CPU 410 transfers a test mode enable command to the interface circuit 40. A preselected pin of the flash memory device 420 detects high voltage levels. If the preselected pin is driven to the high voltage level, then the test mode enable command causes the interface circuit 40 to issue a test mode enable signal 103 to the control access circuit 60. The test mode enable signal 103 causes control of the control access circuit 60 to switch to the interface circuit 40.

During the test mode, the interface circuit 40 controls accesses to the flash array 20 over the central control bus 100. A control register in the control register circuit 84 is accessed over the central control bus 100 to switch back to the normal mode.

The flash array controller 50 writes to the specialized control registers by transferring a write control signal, and a register address along with corresponding write data to the control access circuit 60 over a bus 52. The control access circuit 60 then generates a write cycle over the central control bus 100 to write the addressed specialized control register. The flash array controller 50 reads the specialized control registers by transferring a register address and read control signal to the control access circuit 60 over the bus 52. The control access circuit 60 then generates a read access cycle over the central control bus 100 to read the addressed specialized control register.

The interface circuit 40 writes to the specialized control registers by transferring a write control signal and a strobe signal, along with a register address and corresponding write data to the control access circuit 60 over a bus 42. The control access circuit 60 then generates a write cycle over the central control bus 100 to program the addressed specialized control register. The interface circuit 40 reads the specialized control registers by transferring a register address along with a read control signal and a strobe signal to the control access circuit 60 over the bus 42. The control access circuit 60 then generates a read access cycle over the central control bus 100 to read the addressed specialized control register.

For example, the control register circuit 80 contains specialized control registers and circuitry for controlling the high voltage circuitry of the read/write path 30 according to a set of control signals 90. The high voltage control registers include source switch interface registers, interface registers for controlling VPX and VPIX (i.e., wordline interface programming voltage) multiplexers, VPP/VCC (VCC is the power supply voltage) switch interface registers, interface registers for controlling reference generators, multiplexers and comparators, and programming data path interface registers.

For another example, the control register circuit 81 contains control registers and circuitry for controlling special column access circuitry of the read/write path 30 according to a set of control signals 91. The special column access control registers include mini-array interface registers, redundancy interface registers, imprint interface registers, and content addressable memory interface registers.

The control register circuit 82 contains a set of read only registers for sensing and latching a set of status signals 92 from the read/write path 30. The status signals 92 include the outputs of TTL buffers corresponding to input pads of the flash memory device 420, outputs of the sense amplifiers for the flash cell array 20, page buffer counter outputs, outputs of the comparators in the read/write path 30, and the flash array controller 50 program counter.

The control register circuit 83 contains control registers and circuitry for controlling the read path of the read/write path 30 according to a set of control signals 93. The read path control registers include automatic transition detection interface registers, sensing interface registers, x, y, and z path interface registers.

The control register circuit 84 contains interface registers to the flash array controller 50 and interface registers to the interface circuit 40. The control register circuit 85 contains registers for controlling special test features of the flash memory device 420 according to a set of control signals 95. The special test registers include test mode access registers, VPP capture registers, ready and busy modifier registers, and address allocation registers.

The control register functions listed above are for purposes of example, and not limitation. A wide variety of flash array functions are controlled via control registers programmed over the central control bus 100.

The interface circuit 40 enables access of the flash cell array 20 over the host bus 430 by receiving and processing commands over the host bus 430. The interface circuit 40 receives commands over the data bus 104, verifies the commands, and queues the commands to the flash array controller 50 over a queue bus 41. Thereafter, the flash array controller 50 executes the command and the appropriate portion of the flash memory device 420.

The interface circuit 40 controls an input address multiplexer 35 to select an input address 36 for the read/write path 30. The selected input address 36 is either the address sensed by TTL buffers (not shown) on the address bus 102, or a latched address 37 from the interface circuit 40. The input address 36 may be overridden by programming control registers in the control register circuit 84.

The interface circuit 40 controls an output data multiplexer 45 to select a source for output data transfer over the data bus 104. The selected output data is either flash array data 46 from the read/write path 30, page buffer data 47 from the page buffers 70, or status register data 48 from status registers contained within the interface circuit 40.

The page buffers 70 provide buffer storage areas for write sequences to the flash array 20 over the data bus 104. The page buffers 70 also provide a temporary control store area for the flash array controller 50. For one embodiment, the page buffers 70 are arranged as a set of two 256×8 bit page buffers.

The CPU 410 reads the flash cell array 20 by transferring addresses over the address bus 102 while signaling read cycles over the control bus 106. The interface circuit 40 detects the read cycles and causes the input address multiplexer 35 to transfer the addresses from the address bus 102 through to the x and y decode circuitry of the read/write path 30. The interface circuit 40 also causes the output data multiplexer 45 to transfer the addressed read data from the read/write path 30 over the data bus 104.

The CPU 410 writes data to the flash cell array 20 by generating write cycles over the host bus 430 to transfer write data blocks to the page buffers 70. The interface circuit 40 verifies the write command, and queues the write command to the flash array controller 50. The flash array controller 50 executes the write command by reading the write data from the page buffers over a bus 51, and by programming the write data into appropriate areas of the flash array 20.

The flash array controller 50 implements algorithms for sequencing the high voltage circuitry of the read/write path 30 in order to apply charge to the flash cells of the flash cell array 20 and remove charge from the flash cells of the flash cell array 20. The flash array controller 50 controls the high voltage circuitry and addresses the flash array 20 by accessing the control register circuits 80–85 over the central control bus 100.

The read/write path 30 includes source switch circuitry for applying the appropriate voltage levels to the flash cell array 20 for an erase function. The read/write path 30 also includes program load circuitry for driving program level voltages onto the bit lines of the flash cell array 20 during a programming function.

The interface circuit 40 contains 32 block status registers, wherein each block status register corresponds to one of the blocks of the flash cell array 20. The flash array controller 50 transfers information into the block status registers to indicate the status of each block of the flash cell array 20. The CPU 410 can read the contents of the block status registers over the host bus 430.

Figure 3A:
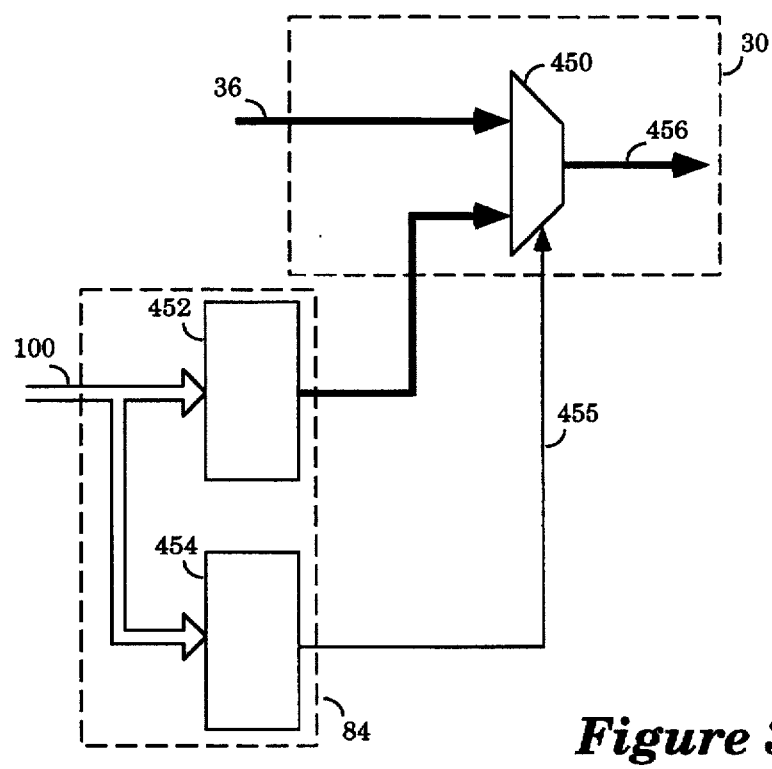
FIG. 3a illustrates the address path for the flash array which is controlled by a control register circuit having a flash array address register and a flash array address control register.

FIG. 3a illustrates the address path for the flash array 20. The control register circuit 84 includes a flash array address register 452 and a flash array address control register 454. The flash array address register 452 and the flash array address control register 454 are programmed over the central control bus 100.

The flash array address control register 454 is loaded to generate a control signal 455. The control signal 455 causes a multiplexer 450 to transfer either the input address 36 or the contents of the flash array address register 452 to the x and y decoders over signal lines 456.

Figure 3B:
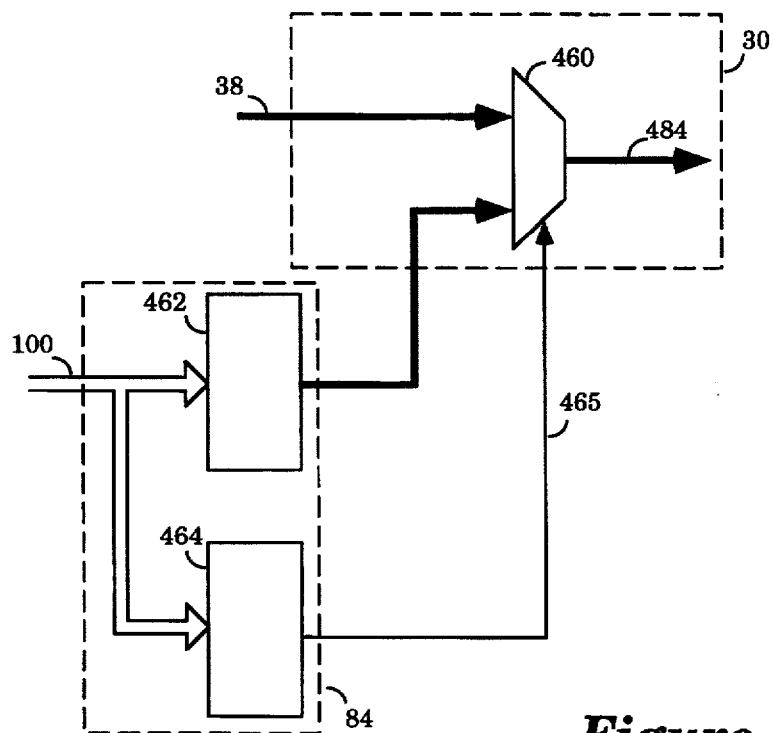
FIG. 3b illustrates the input data path for the flash array which is controlled by a control register circuit having a flash array data register and a flash array data control register.

FIG. 3b illustrates the input data path for the flash array 20. The control register circuit 84 includes a flash array data register 462 and a flash array data control register 464. The flash array data register 462 and the flash array data control register 464 are loaded over the central control bus 100. The flash array data control register 464 generates a control signal 465. The control signal 465 causes a multiplexer 460 to transfer either the input data 38 or the contents of the flash array data register 462 to the program load circuitry of the read/write path 30.

Figure 4:
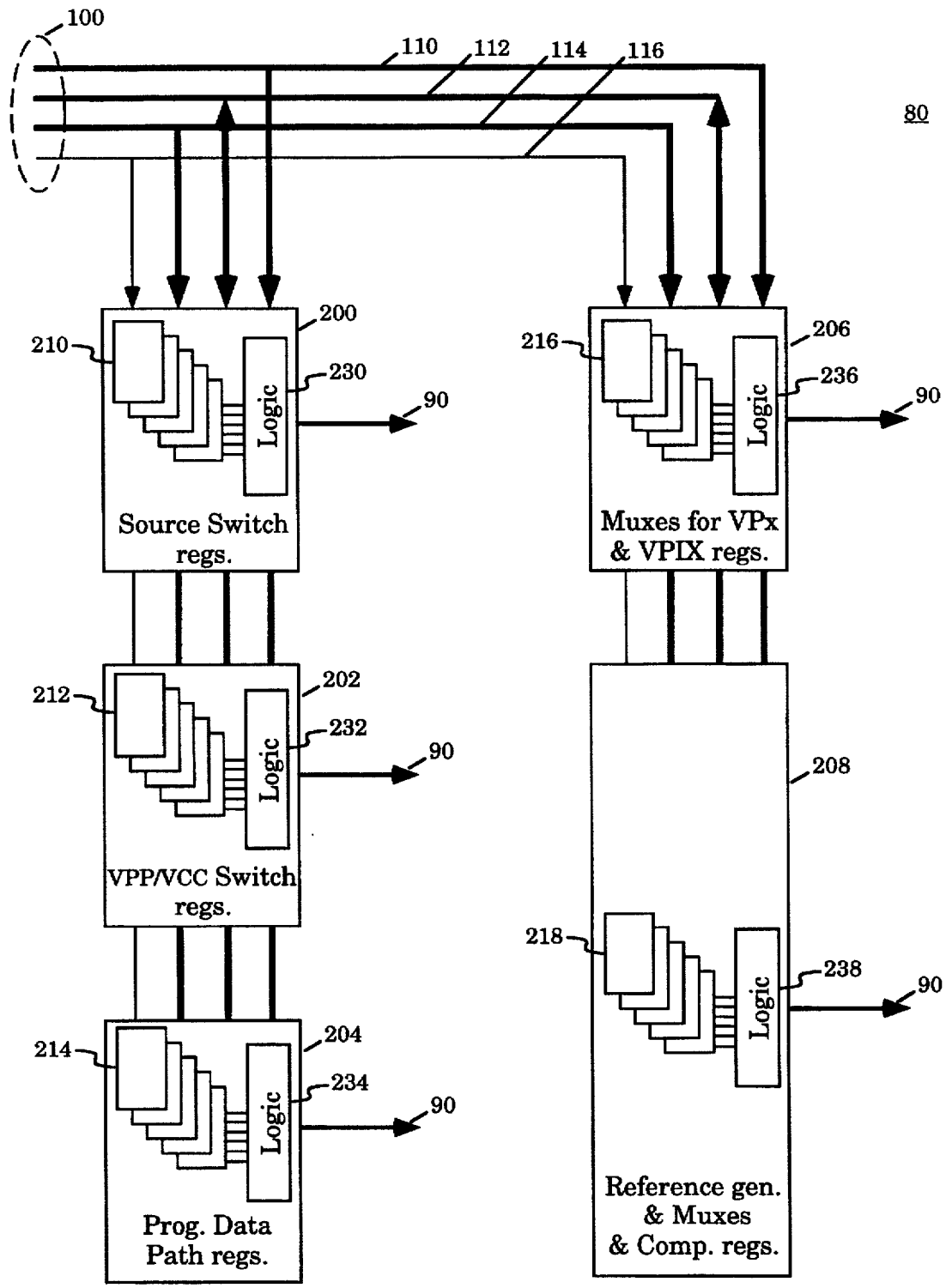
FIG. 4 is a block diagram of a control register circuit and shows the central control bus comprising a flash I/O address (FIOADD) bus, a flash I/O data (FIODAT) bus, a flash I/O control (FIOCTL) bus, and a strobe signal.

FIG. 4 is a block diagram of the control register circuit 80. The central control bus 100 comprises a flash I/O address (FIOADD) bus 110, a flash I/O data (FIODAT) bus 112, a flash I/O control (FIOCTL) bus 114, and a strobe signal 116.

The control register circuit 80 comprises a set of control circuitry 200 for the source switch registers, a set of control circuitry 202 for the VPP/VCC switch circuitry, a set of control circuitry 204 for the program data path, a set of control circuitry 206 for the VPX and VPIX multiplexer circuitry, and a set of control circuitry 208 for the reference generator, multiplexer, and comparator register circuits.

Each of the control circuits 200–208 contains a set of control registers along with associated specialized logic. For example, the control circuit 200 comprises a set of control registers 210, and a logic circuit 230 for the source switch circuitry. The control registers 210 are programmed over the central control bus 100.

Figure 5:
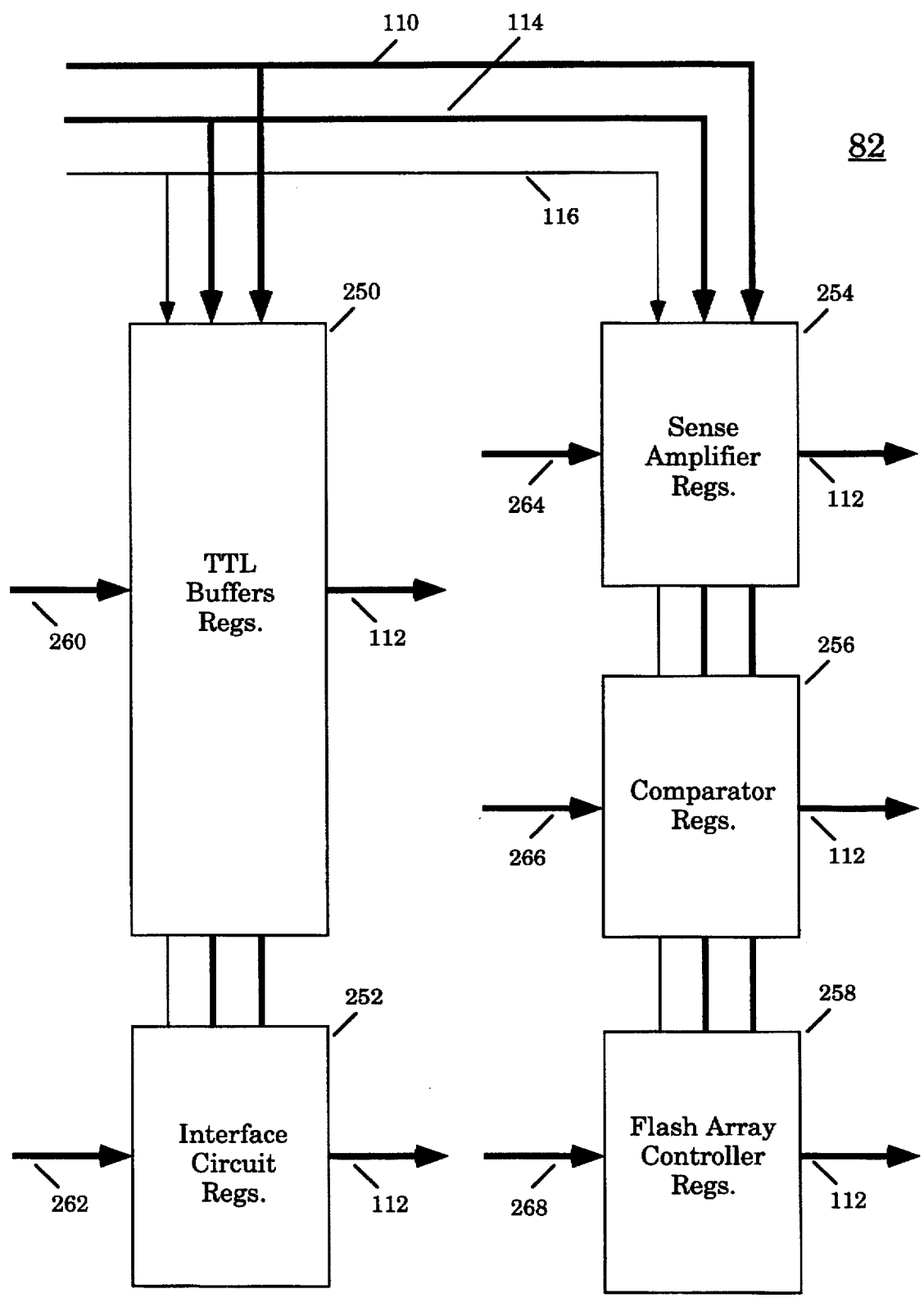
FIG. 5 illustrates a control circuit which contains a set of read only control registers.

FIG. 5 illustrates the control circuit 82 which contains a set of read only control registers. The read only control registers comprise a set of TTL buffers registers 250, a set of interface circuit registers 252, a set of sense amplifier output registers 254, a set of comparator output registers 256, and a set of flash array controller registers 258. The read only register sets 250–258 are read over the over the central control bus 100.

The TTL buffers registers 250 receive and store a set of outputs 260 from the TTL buffers corresponding to the input pads of the flash memory device 420. The interface circuit registers 252 receive and store status signals 262 from the interface circuit 40 that indicate the status of the page buffer 70 and the status of the command queue to the flash array controller 50. The sense amplifier output registers 254 receive and store outputs 264 from the sense amplifier circuits for the flash array 20. The comparator output registers 256 receive and store the outputs 266 of the comparator circuits of the read/write path 30. The flash array controller registers 258 receive and store status signals 268 that indicate the contents of the program counter of the flash array controller 50.

Figure 6A:
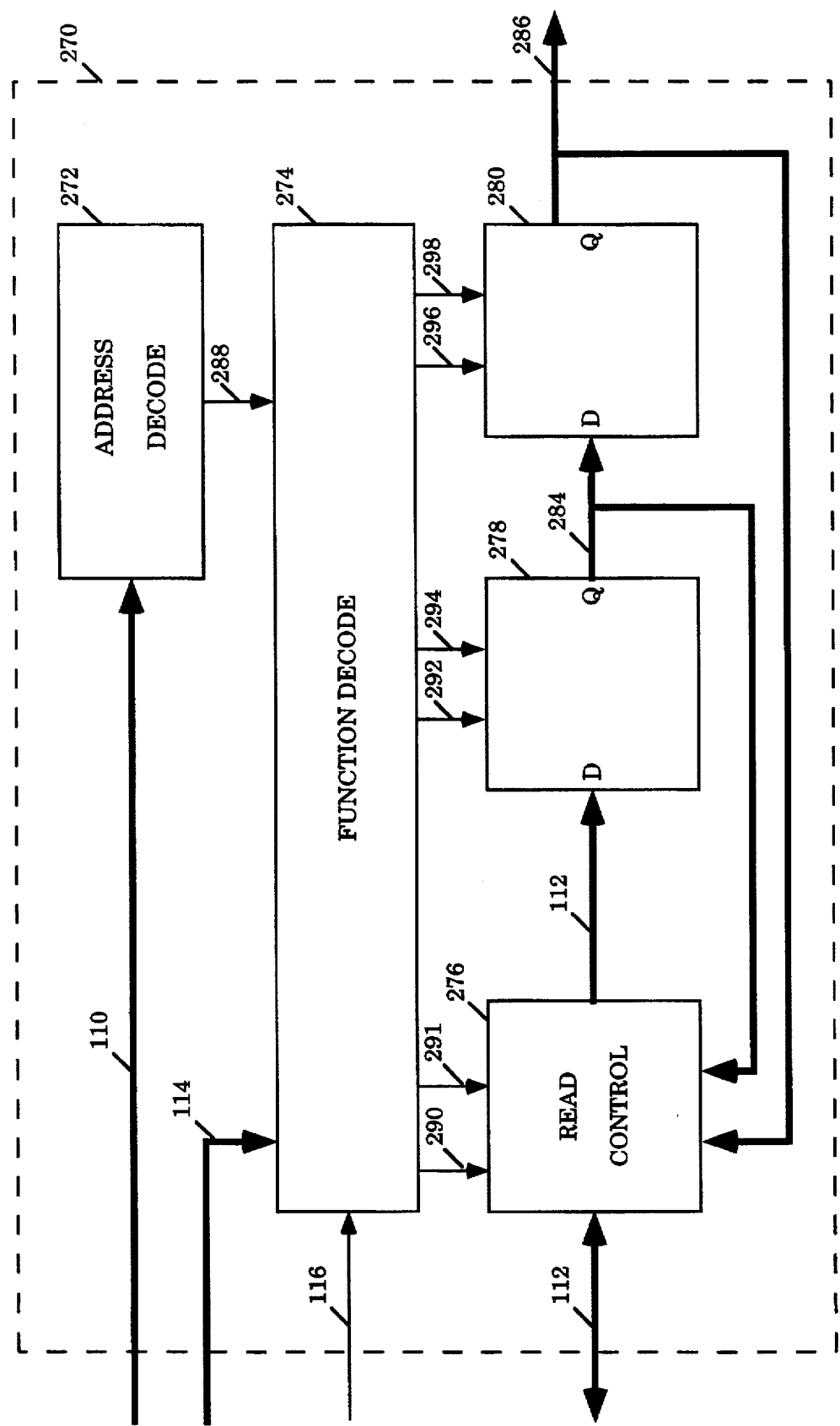
FIG. 6a illustrates a control register comprising an address decode circuit, a function decode circuit, a read control circuit, and a pair of data latches.

FIG. 6a illustrates a control register 270. The control register 270 is comprised of an address decode circuit 272, a function decode circuit 274, a read control circuit 276, and a pair of data latches 278 and 280. The data latch 278 is a master data latch, and the data latch 280 is a slave data latch. The control register 270 is substantially similar to all of the control registers contained in the control register circuits 80, 81, and 83–85.

The control register 270 is selected by an address on the FIOADD bus 110. Data is transferred to the control register 270 over the FIODAT bus 112. An access mode for the control register 270 is indicated on the FIOCTL bus 114, and data transfer is synchronized by the strobe signal 116.

The address decode circuit 272 receives and decodes addresses received over the FIOADD bus 110, and generates a control signal 288 if the address corresponds to the control register 270. The control signal 288 causes the function decode circuit 274 to decode the access mode on the FIOCTL bus 114 and perform the specified access mode function. An output 286 of the slave data latch 280 provides control signals for specialized control logic to drive the read/write path 30.

FIG. 6b defines the access modes specified on the FIOCTL bus 114 for one embodiment. The access modes are read master, read slave, reset master, reset slave, reset both master and slave, load master, transfer master to slave, and load master/transfer to slave.

The access modes of read master, read slave, load master, and load master/transfer to slave operate on individual control registers and require an address to be provided on the FIOADD bus 110. The remaining access modes operate globally on all control registers coupled to the central control bus 100 and do not require an address to be provided on the FIOADD bus 110. The load master and load slave access modes require data to be provided on the FIODAT bus 112. The read master and read slave access modes drive data on to the FIODAT bus 112. The access modes of load master, and load master/transfer to slave are synchronized by the strobe signal 116.

If the FIOCTL bus 114 specifies the read master access mode, the function decode circuit 274 issues a control signal 290 which causes the read control circuit 276 to transfer the output 284 of the master data latch 278 over the FIODAT bus 112.

If the FIOCTL bus 114 specifies the read slave access mode, the function decode circuit 274 issues a control signal 291 which causes the read control circuit 276 to transfer the output 286 of the slave data latch 280 over the FIODAT bus 112.

If the FIOCTL bus 114 specifies the reset master access mode, the function decode circuit 274 issues a control signal 294 which causes the master data latch 278 to reset. If the FIOCTL bus 114 specifies the reset slave access mode, the function decode circuit 274 issues a control signal 298 which causes the slave data latch 280 to reset. If the FIOCTL bus 114 specifies the reset both master and slave access mode, the function decode circuit 274 issues the control signals 294 and 298 to reset the master and slave data latches 278 and 280.

If the FIOCTL bus 114 specifies the load master access mode, the function decode circuit 274 issues a control signal 292 which causes the master data latch 278 to load from the FIODAT bus 112.

If the FIOCTL bus 114 specifies the transfer master to slave access mode, the function decode circuit 274 issues a control signal 296 which causes the slave data latch 280 to load from the output 284 of the master data latch 278.

If the FIOCTL bus 114 specifies the load master/transfer to slave access mode, the function decode circuit 274 issues the control signal 292 which causes the master data latch 278 to load from the FIODAT bus 112. The function decode circuit 274 also issues the control signal 296 which causes the slave data latch 280 to load from the output 284 of the master data latch 278.

Figure 7:
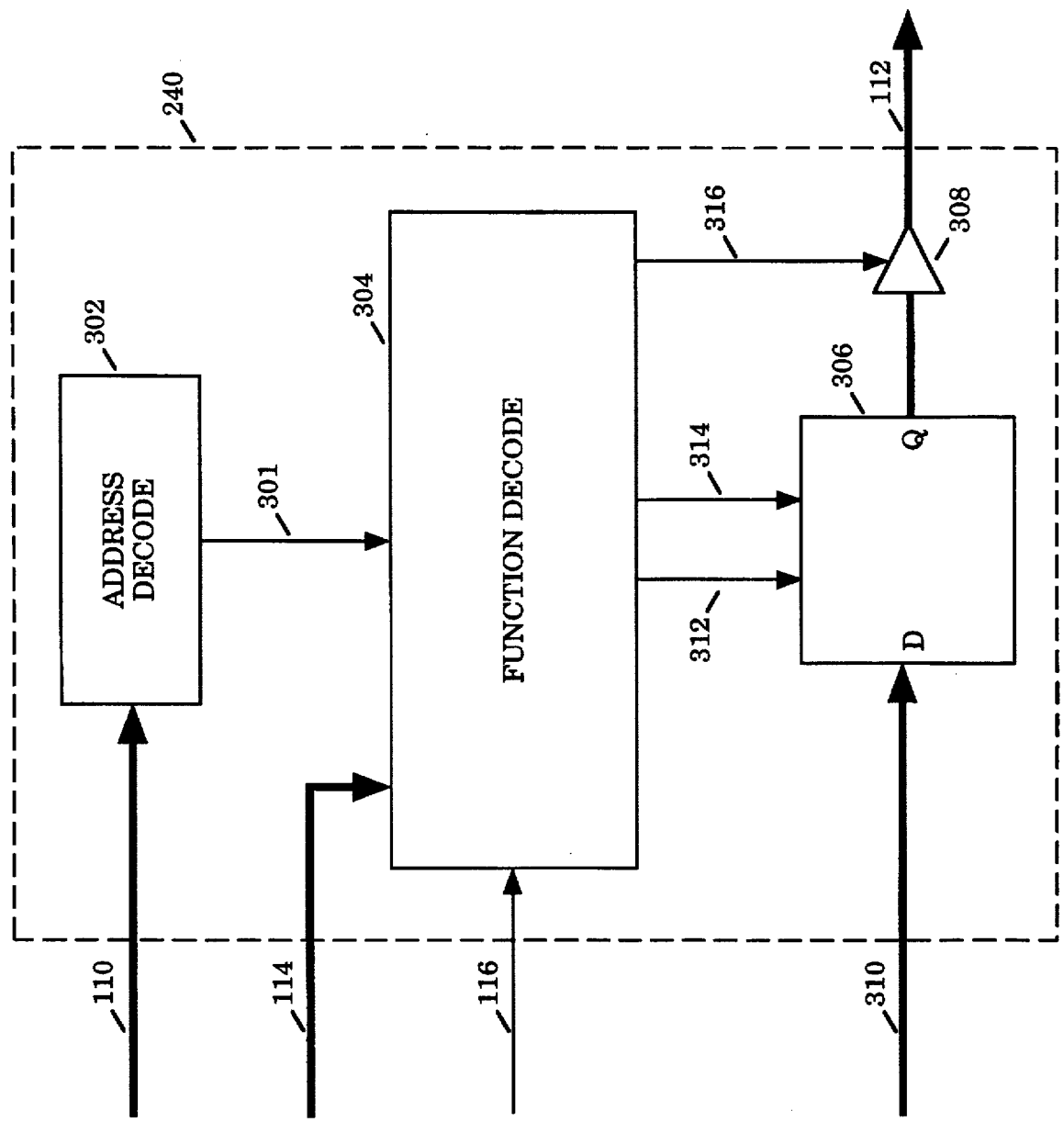
FIG. 7 illustrates a read only control register which receives and stores a set of read only signals.

FIG. 7 illustrates a read only control register 240 which receives and stores a set of read only signals 310. The read only control register 240 is substantially similar to all the read only control registers contained in the control register circuit 82. The read only control register 240 is comprised of an address decode circuit 302, a function decode circuit 304, and a data latch 306 along with a driver circuit 308.

The read only control register 240 is selected by an address on the FIOADD bus 110. Data is read from the read only control register 240 over the FIODAT bus 112. The read access mode for the read only control register 240 is indicated on the FIOCTL bus 114.

The address decode circuit 302 receives and decodes addresses received over the FIOADD bus 110, and generates a control signal 301 if the address corresponds to the read only control register 240. The control signal 301 causes the function decode circuit 304 to decode the access mode on the FIOCTL bus 114 and perform the specified access mode function.

If the FIOCTL bus 114 specifies a read access mode, the function decode circuit 304 issues a control signal 316 which causes the driver circuit 308 to transfer the output of the data latch 306 over the FIODAT bus 112.

If the FIOCTL bus 114 specifies the reset access mode, the function decode circuit 304 issues a control signal 314 which causes the data latch 306 to reset.

If the FIOCTL bus 114 specifies the load access mode, the function decode circuit 304 issues a control signal 312 which causes the data latch 306 to load from the read only signals 310.

Figure 8:
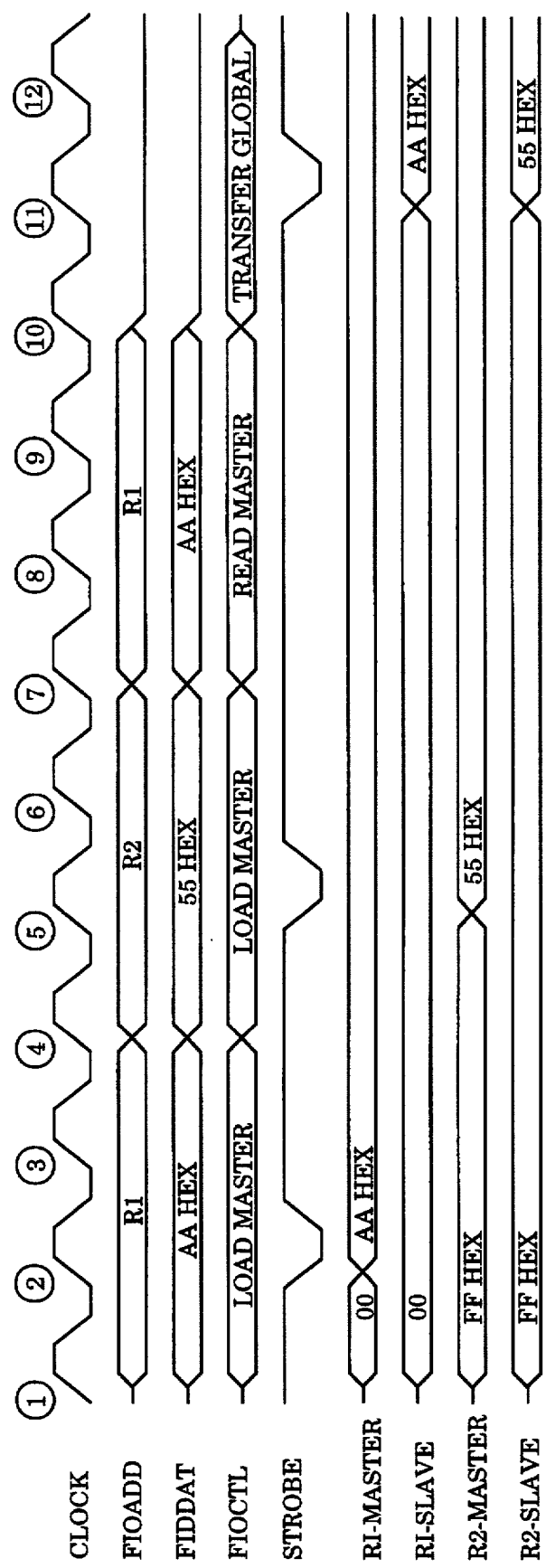
FIG. 8 is a timing diagram which illustrates an example transfer sequence on the central control bus synchronized by a clock (CLOCK) signal.

FIG. 8 is a timing diagram which illustrates an example transfer sequence on the central control bus 100 synchronized by a clock (CLOCK) signal. The timing diagram shows timing for the FIOADD bus 110, the FIODAT bus 112, the FIOCTL bus 114, and the strobe signal 116. Also shown is the timing for the contents of the master and slave portions of a pair of control register (R1 and R2).

At clock 1, the control access circuit 60 transfers the address of register R1 over the FIOADD bus 110, the value AA hex over the FIODAT bus 112, and the load master access mode over the FIOCTL bus 114. At clock 2, the strobe signal 116 causes loading of the R1 master with AA hex from the FIODAT bus 112.

At clock 4, the control access circuit 60 transfers the address of register R2 over the FIOADD bus 110, the value 55 hex over the FIODAT bus 112, and the load master access mode over the FIOCTL bus 114. At clock 5, the strobe signal 116 causes loading of the R2 master with 55 hex from the FIODAT bus 112.

At clock 7, the control access circuit 60 transfers the address of register R1 over the FIOADD bus 110, and the read master access mode over the FIOCTL bus 114. The registers R1 transfers the value AA hex over the FIODAT bus 112.

At clock 10, the control access circuit 60 transfers the transfer master to slave global access mode over the FIOCTL bus 114. At clock 11, the strobe signal 116 causes loading of the R1 slave with AA hex from the R1 master, and loading of the R2 slave with 55 hex from the R1 master.

Figure 9:
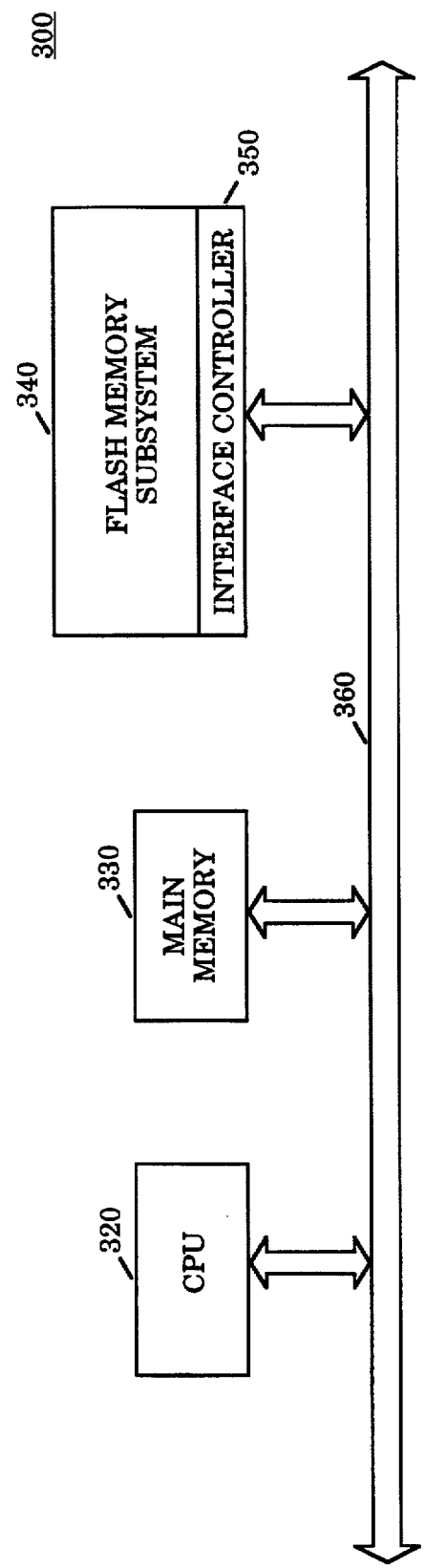
FIG. 9 is a block diagram of a computer system comprising a CPU, a main memory subsystem, and a flash memory subsystem.

FIG. 9 is a block diagram of a computer system 300. The computer system 300 is comprised of a central processing unit (CPU) 320, a main memory subsystem 330, and a flash memory subsystem 340. The flash memory subsystem 340 includes an interface controller 350. The CPU 320, the main memory subsystem 330, and the flash memory subsystem 340 communicate over a host bus 360. The interface controller 350 enables access of the flash memory subsystem 340 over the host bus 360.

The flash memory subsystem 340 is comprised of a set of flash memory devices such as the flash memory device 420 described above. The interface controller 350 receives access requests for the flash memory subsystem 340 over the host bus 360. The interface controller 350 maps the access requests to the appropriate flash memory device of the flash memory subsystem 340. The interface controller 350 then accesses the appropriate flash memory device according to the access requests in the manner described above.

Figure 10:
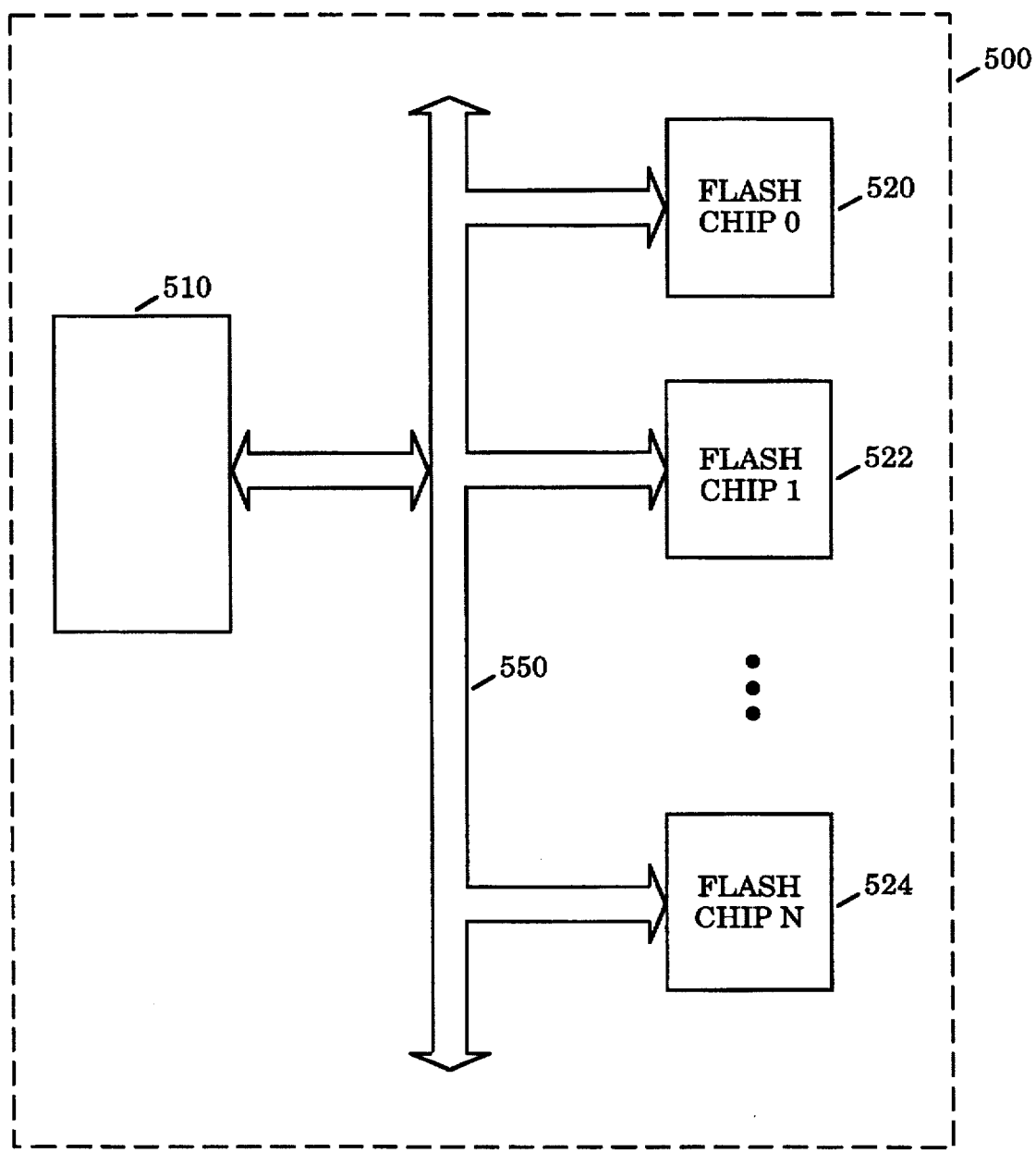
FIG. 10 illustrates a flash memory device test system comprising a test controller, and a set of flash memory devices.

FIG. 10 illustrates a flash memory device test system 500. The flash memory device test system 500 is comprised of a test controller 510, and a set of flash memory devices 520–524. The test controller 510 communicates with the flash memory devices 520–524 over a host bus 550. The flash memory devices 520–524 are substantially similar to the flash memory device 420 described above. For one embodiment the controller 510 is a microprocessor. For alternate embodiments, the controller 510 is an integrated circuit tester.

The test controller 510 controls the testing modes for the flash memory devices 520–524. The test controller 510 transfers the test mode enable command to each of the flash memory devices 520–524 over the host bus 550. The test mode enable commands cause the interface circuits of each of the flash memory devices 520–524 to assert control over the flash control busses. Thereafter, the test controller 510 programs and reads the control registers of each of the flash memory devices 520–524 to perform the test functions.

Alternatively, the flash array controller circuits of each of the flash memory devices 520–524 assert control over the flash control busses and perform the test functions.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A memory device, comprising:

a cell array comprising a plurality of memory cells;

a read/write circuit coupled to the cell array and comprising circuitry that performs select, write, read, verify, and repair operations on the memory cells according to a plurality of control signals;

a plurality of control register circuits coupled to the read/write circuit and comprising a plurality of control registers that generate the control signals to the read/write circuit, the plurality of control registers programmed over a central control bus;

a control access circuit coupled to the plurality of control register circuits via the central control bus, the control access circuit translating an access request into an access cycle on the central control bus, the access cycle loading the plurality of control registers by transferring write control signals, read control signals, register addresses, data, and strobe signals.

2. The memory device of claim 1, wherein the control access circuit receives the access request targeted for the control register from an array controller circuit, the array controller circuit generating the access request which is then translated into the access cycle to load the control register and generate the control signals according to a user command received over a host bus.

3. The memory device of claim 2, wherein the user command comprises a test mode enable command which causes an interface circuit to issue a test mode enable signal to the control access circuit if a preselect input/output pin of the memory device senses a high voltage level, the test mode enable signal causing the control access circuit to receive the access request targeted for the control register from a user over the host bus.

4. The memory device of claim 1, wherein the control register comprises comprise a plurality of high voltage control registers for controlling a set of high voltage circuits that apply high voltage levels to the memory cells.

5. The memory device of claim 1, wherein the control register comprises a plurality of read only registers for storing output data of a plurality of TLL (Transistor-Transistor Logic) buffer outputs corresponding to a set of address and data pins of the memory device, and for storing output data of a plurality of outputs from a set of sense amplifiers coupled to the cell array.

6. The memory device of claim 1, wherein the central control bus comprises an address bus, a data bus, a control bus, and a strobe signal.

7. The memory device of claim 6, wherein the control register comprises:
- an address decode circuit coupled to the address bus, the address decode circuit generating a first control signal if an address on the address bus corresponds to the control register;
- a function decode circuit coupled to the control bus and the strobe signal, the function decode circuit generating a read control signal, a master control signal, and a slave control signal according to an access mode on the control bus;
- a master data latch coupled to the data bus and the master control signal, the master data latch generating a first output signal by latching the data bus according to the master control signal;
- a slave data latch coupled to the first output signal and the slave control signal, the slave data latch generating a control output signal by latching the first output signal according to the slave control signal;
- a read control circuit coupled to the data bus and coupled to receive the first output signal, the control output signal, and the read control signal, the read control signal transferring the first output signal or the control output signal over the data bus according to the read control signal.

8. A method for accessing a memory cell array of a memory device, comprising the steps of:
- generating a write access request targeted for a control register of a control register circuit in the memory device;
- translating the write access request into a write cycle using a control access circuit in the memory device coupled to the control register, the write cycle loading the control register by transferring a plurality of control signals the plurality of control signals comprising write control signals, read control signals, register addresses, data, and strobe signals;
- selecting, writing, reading, verifying and repairing the memory cell array in response to the control signals received by a read/write circuit.

9. The method of claim 8, wherein the write access request targeted for the control register is received from an array controller circuit, the array controller circuit generating the write access request which is then translated into the write cycle to load the control register and generate the control signals according to a user command received over a host bus.

10. The method of claim 8, wherein the write access request targeted for the control register is received from a user over a host bus, the user generating the write access request to load the control register and generate the control signals to select, write, and read the memory cell array.

11. The method of claim 8, wherein the control register circuit comprises a high voltage control register circuit for controlling a set of high voltage circuits that apply high voltage levels to the memory cell array.

12. The method of claim 8, wherein the control register circuit comprises a plurality of read only registers for storing output data of a plurality of TTL (Transistor-Transistor Logic) buffer outputs corresponding to a set of address and data pins of the memory device, and for storing the output data of a plurality of outputs from a set of sense amplifiers coupled to the memory cell array.

13. The method of claim 8, wherein the central control bus comprises an address bus, a data bus, a control bus, and a strobe signal.

14. The method of claim 13, wherein the control register comprises:
- address decode circuit coupled to the address bus, the address decode circuit generating a first control signal if an address on the address bus corresponds to the control register;
- function decode circuit coupled to the control bus and the strobe signal, the function decode circuit generating a read control signal, a master control signal, and a slave control signal according to an access mode on the control bus;
- master data latch coupled to the data bus and the master control signal, the master data latch generating a first output signal by latching the data bus according to the master control signal;
- slave data latch coupled to the first output signal and the slave control signal, the slave data latch generating a control output signal by latching the first output signal according to the slave control signal;
- read control circuit coupled to the data bus and coupled to receive the first output signal, the control output signal, and the read control signal, the read control signal transferring the first output signal or the control output signal over the data bus according to the read control signal.

15. A circuit for accessing a memory cell array of a memory device, comprising:
- a circuit for generating a write access request targeted for a control register of a control register circuit in the memory device;
- a control access circuit for translating the write access request into a write cycle in the memory device, the control access circuit coupled to the control register, the write cycle loading the control register by transferring a plurality of control signals, the plurality of control signals comprising write control signals, read control signals, register addresses, data, and strobe signals;
- a read/write circuit for selecting, writing, reading, verifying and repairing the memory cell array according to the control signals.

16. The circuit of claim 15, wherein the write access request targeted for the control register is received from an array controller circuit, the array controller circuit generating the write access request which is then translated into the write cycle to load the control register and generate the control signals according to a user command received over a host bus.

17. The circuit of claim 15, wherein the write access request targeted for the control register is received from a user over a host bus, the user generating the access request that is then translated into the write cycle to load the control register and generate the control signals to select, write, and read the memory cell array.

18. The circuit of claim 15, wherein the control register circuit comprises a high voltage control register circuit for controlling a set of high voltage circuits that apply high voltage levels to the memory cell array.

19. The circuit of claim 15, wherein the control register circuit comprises a plurality of read only registers for storing output data of a plurality of TTL (Transistor-Transistor Logic) buffer outputs corresponding to a set of address and data pins of the memory device, and for storing output data of a plurality of outputs from a set of sense amplifiers coupled to the memory cell array.

20. The circuit of claim 15, wherein the central control bus comprises an address bus, a data bus, a control bus, and a strobe signal.

21. The circuit of claim 20, wherein the control register comprises:

address decode circuit coupled to the address bus, the address decode circuit generating a first control signal if an address on the address bus corresponds to the control register;

function decode circuit coupled to the control bus and the strobe signal, the function decode circuit generating a read control signal, a master control signal, and a slave control signal according to an access mode on the control bus;

master data latch coupled to the data bus and the master control signal, the master data latch generating a first output signal by latching the data bus according to the master control signal;

slave data latch coupled to the first output signal and the slave control signal, the slave data latch generating a control output signal by latching the first output signal according to the slave control signal;

read control circuit coupled to the data bus and coupled to receive the first output signal, the control output signal, and the read control signal, the read control signal transferring the first output signal or the control output signal over the data bus according to the read control signal.

22. A computer system, comprising:

a main memory that stores a set of write data for a write operation;

a central processing unit coupled to the main memory via a host bus, the central processing unit reads the write data from the main memory and transfers a write command and the write data over the host bus;

a memory device coupled to the host bus external to the memory device and having a memory cell array and a central control bus, further comprising (i) a read/write circuit coupled to the memory cell array that writes to, verifies, and repairs memory cells of the memory cell array according to a plurality of control signals, (ii) a control register circuit coupled to the read/write circuit and having a control register that generates the control signals to the read/write circuit, and (iii) a control access circuit coupled to the control register circuit via a central control bus, wherein the control access circuit receives an access request targeted for the control register according to the write command, and translates the access request into an access cycle on the central control bus, the access cycle loading the control register and causing the control register circuit to generate write control signals, read control signals, register addresses, data, and strobe signals.

23. The computer system of claim 22, wherein the control access circuit receives the access request targeted for the control register from an array controller circuit in the memory device, the array controller circuit generating the access request that is then translated into the access cycle to load the control register and generate the control signals according to the write command received over the host bus.

24. The computer system of claim 22, wherein the central processing unit transfers a test mode enable command over the host bus which causes an interface circuit to issue a test mode enable signal to the control access circuit if a preselect input/output pin of the memory device senses a high voltage level, the test mode enable signal causing the control access circuit to receive the access request targeted for the control register from the central processing unit over the host bus.

25. The computer system of claim 22, wherein the control register comprises a plurality of high voltage control registers for controlling a set of high voltage circuits that apply high voltage levels to the memory cells.

26. The computer system of claim 22, wherein the control register comprises a plurality of read only registers for storing output data of a plurality of TTL (Transistor-Transistor Logic) buffer outputs corresponding to a set of address and data pins of the memory device, and for storing output data of a plurality of outputs from a set of sense amplifiers coupled to the memory cell array.

27. The computer system of claim 22, wherein the central control bus comprises an address bus, a data bus, a control bus, and a strobe signal.

28. The computer system of claim 27, wherein the control register comprises:

an address decode circuit coupled to the address bus, the address decode circuit generating a first control signal if an address on the address bus corresponds to the control register;

a function decode circuit coupled to the control bus and the strobe signal, the function decode circuit generating a read control signal, a master control signal, and a slave control signal according to an access mode on the control bus;

a master data latch coupled to the data bus and the master control signal, the master data latch generating a first output signal by latching the data bus according to the master control signal;

a slave data latch coupled to the first output signal and the slave control signal, the slave data latch generating a control output signal by latching the first output signal according to the slave control signal;

a read control circuit coupled to the data bus and coupled to receive the first output signal, the control output signal, and the read control signal, the read control signal transferring the first output signal or the control output signal over the data bus according to the read control signal.

* * * * *

UNITED STATES PATENT AND TRADEMARK OFFICE
CERTIFICATE OF CORRECTION

PATENT NO.   : 5,748,939
DATED        : May 5, 1998
INVENTOR(S)  : Rozman et al.

It is certified that error appears in the above-identified patent and that said Letters Patent is hereby corrected as shown below:

Column 11,
Line 62, after first occurrence of "signals", insert -- , --.

Signed and Sealed this

Twenty-second Day of July, 2003

JAMES E. ROGAN
*Director of the United States Patent and Trademark Office*